(12) United States Patent
Ohara et al.

(10) Patent No.: US 12,467,161 B2
(45) Date of Patent: Nov. 11, 2025

(54) METHOD FOR MANUFACTURING SEMICONDUCTOR DEVICE, AND SEMICONDUCTOR WAFER

(71) Applicants: DENSO CORPORATION, Kariya (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP); National University Corporation Tokai National Higher Education and Research System, Nagoya (JP)

(72) Inventors: Junji Ohara, Nisshin (JP); Takashi Ishida, Nisshin (JP); Yoshitaka Nagasato, Nisshin (JP); Daisuke Kawaguchi, Hamamatsu (JP); Chiaki Sasaoka, Nagoya-shi (JP); Shoichi Onda, Nagoya (JP); Jun Kojima, Nagoya (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP); National University Corporation Tokai National Higher Education and Research System, Nagoya (JP)

(*) Notice: Subject to any disclaimer, the term of this patent is extended or adjusted under 35 U.S.C. 154(b) by 553 days.

(21) Appl. No.: 17/988,379

(22) Filed: Nov. 16, 2022

(65) Prior Publication Data

US 2023/0160104 A1 May 25, 2023

(30) Foreign Application Priority Data

Nov. 19, 2021 (JP) ................. 2021-188623

(51) Int. Cl.
*C30B 33/04* (2006.01)
*B23K 26/382* (2014.01)
(Continued)

(52) U.S. Cl.
CPC ............ *C30B 33/04* (2013.01); *B23K 26/382* (2015.10); *C30B 25/20* (2013.01); *C30B 29/406* (2013.01);
(Continued)

(58) Field of Classification Search
CPC ............ H01L 21/7806; H01L 21/7813; C30B 29/406; C30B 33/04; B23K 26/53
See application file for complete search history.

(56) References Cited

U.S. PATENT DOCUMENTS 11,862,583 B2 * 1/2024 Loh .................. H01L 21/78
11,887,894 B2 * 1/2024 Santos Rodriguez ......................
H01L 21/02002
(Continued)

FOREIGN PATENT DOCUMENTS

| JP | 2008-108779 A | 5/2008 |
|---|---|---|
| JP | 2012-142385 A | 7/2012 |
| JP | 2020-096135 A | 6/2020 |

*Primary Examiner* — Jaehwan Oh
(74) *Attorney, Agent, or Firm* — Posz Law Group, PLC

(57) ABSTRACT

A method for manufacturing a semiconductor device includes: preparing a processed wafer having a gallium nitride (GaN) wafer and an epitaxial layer on the GaN wafer; forming a device constituent part in a portion of the processes wafer adjacent to a front surface provided by the epitaxial layer; forming a modified layer inside of the processed wafer by applying a laser beam from a back surface side opposite to the front surface side; and dividing the processed wafer at the modified layer. The processed wafer prepared includes a reflective layer for reflecting the laser beam at a position separated from a planned formation position, where the modified layer is to be formed, by a (Continued)

predetermined distance toward the front surface side. The reflective layer contains a layer having a refractive index different from that of a GaN single crystal of an epitaxial layer.

12 Claims, 12 Drawing Sheets

(51) Int. Cl.
    *C30B 25/20*     (2006.01)
    *C30B 29/40*     (2006.01)
    *H01L 21/268*     (2006.01)
    *H01L 21/78*     (2006.01)

(52) U.S. Cl.
    CPC ........ *H01L 21/268* (2013.01); *H01L 21/7806* (2013.01)

(56) References Cited

U.S. PATENT DOCUMENTS

| | | | |
|---|---|---|---|
| 12,098,476 B2* | 9/2024 | Kaneko | H01L 21/02579 |
| 2014/0038392 A1* | 2/2014 | Yonehara | B81C 1/0038 |
| | | | 438/463 |
| 2014/0334511 A1* | 11/2014 | Takeda | H01S 5/32341 |
| | | | 372/41 |
| 2016/0288250 A1* | 10/2016 | Hirata | H10D 62/405 |
| 2016/0293397 A1* | 10/2016 | Hirata | H01L 21/304 |
| 2017/0372965 A1* | 12/2017 | Nishibayashi | H10D 62/8303 |
| 2019/0224784 A1* | 7/2019 | Fujiwara | B23K 26/53 |
| 2020/0224332 A1* | 7/2020 | Hu | H01L 21/76254 |
| 2022/0352027 A1* | 11/2022 | Hoshi | H01L 21/02389 |

* cited by examiner

METHOD FOR MANUFACTURING SEMICONDUCTOR DEVICE, AND SEMICONDUCTOR WAFER

CROSS REFERENCE TO RELATED APPLICATION

The present application claims the benefit of priority from Japanese Patent Application No. 2021-188623 filed on Nov. 19, 2021. The entire disclosures of the above application are incorporated herein by reference.

TECHNICAL FIELD

The present disclosure relates to a method for manufacturing a semiconductor device, and a semiconductor wafer used for manufacturing the semiconductor device.

BACKGROUND

In a method for manufacturing a semiconductor device, it has been known to perform a laser slicing to a semiconductor wafer containing a single crystal of gallium nitride (hereinafter also simply referred to as GaN). In such a method, a processed wafer (that is, a semiconductor wafer) in which an epitaxial layer is stacked on a GaN wafer is prepared. The processed wafer has a front surface on the epitaxial layer side, and a back surface on the GaN wafer side. After forming device constituent parts on the front surface side of the processed wafer, the laser slicing is performed. In the laser slicing, a modified layer is formed by applying a laser beam from the back surface side of the processed wafer. The processed wafer is divided into plural wafers in a thickness direction of the processed wafer at the modified layer as a starting point of dividing.

SUMMARY

The present disclosure describes a method for manufacturing a semiconductor device, and a semiconductor wafer used for the method for manufacturing the semiconductor device. According to an aspect, a method for manufacturing a semiconductor device may include: preparing a processed wafer having a gallium nitride (GaN) wafer containing a single crystal of GaN and an epitaxial layer containing a single crystal of GaN on the GaN wafer; forming a device constituent part in a portion of the processed wafer on a front surface side adjacent to the epitaxial layer; forming a modified layer in the processed wafer by applying a laser beam from a back surface side opposite to the front surface side; and dividing the processed wafer at the modified layer into a device constituent wafer on the front surface side and a back surface-side wafer on the back surface side. The processed wafer prepared includes a reflective layer for reflecting the laser beam in the epitaxial layer and at a position separated from a planned formation position, where the modified layer is to be formed, by a predetermined distance toward the front surface side. The reflective layer may contain a layer having a refractive index different from that of the single crystal of the GaN of the epitaxial layer.

BRIEF DESCRIPTION OF THE DRAWINGS

Objects, features and advantages of the present disclosure will become more apparent from the following detailed description made with reference to the accompanying drawings, in which.

DETAILED DESCRIPTION

Figure 1A:
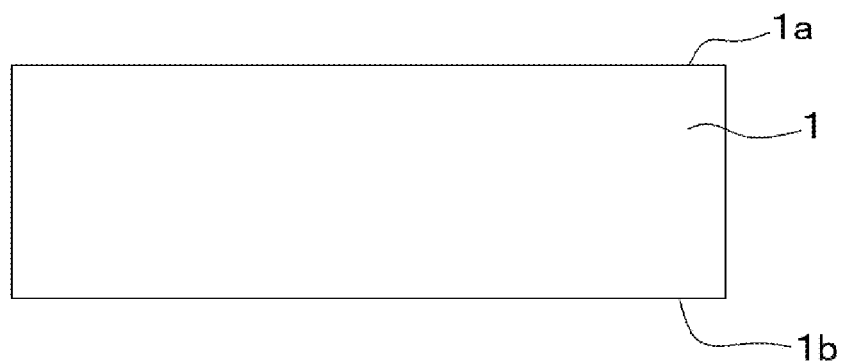
FIG. 1A is a cross-sectional view illustrating a manufacturing process for a semiconductor device according to a first embodiment.

To begin with, a relevant technology will be described only for understanding the embodiments of the present disclosure. For example, in a method for manufacturing a semiconductor device, it has been known to perform a laser slicing to a semiconductor wafer containing a single crystal of gallium nitride (hereinafter also simply referred to as GaN). In the laser slicing, a modified layer is formed by applying a laser beam from a back surface side of the processed wafer, the back surface side being opposite to a front surface side in which device constituent parts has been formed. The processed wafer is divided into plural wafers in a thickness direction of the processed wafer at the modified layer as a starting point of dividing.

When the modified layer is formed by applying the laser beam from the back surface side of the processed wafer, a part of the laser beam is likely to leak toward the front surface side of the processed wafer. If the leaked laser beam reaches the device constituent parts on the front surface side, the laser beam is absorbed by the device constituent parts and heat is generated. If the device constituent parts are affected by the heat, characteristics of devices are likely to be degraded.

In order to suppress the influence of heat onto the device constituent parts, it is conceivable to form a laser absorbing layer in the processed wafer at a position closer to the front surface than a planned formation position of the modified layer where the modified layer is to be formed. By absorbing the laser beam leaking toward the front surface of the processed wafer by the laser absorbing layer and transforming the absorbed laser beam into heat, it may be possible to restrict the leaked laser beam from reaching the device constituent parts on the front surface side of the processed wafer.

In such a method, however, there is a possibility that another modified layer will be formed due to the laser absorbing layer absorbed the laser beam generating heat. The heat generated by the laser absorbing layer due to the absorption of the laser beam may adversely affect GaN crystal of the devices. Namely, the heat may adversely affect characteristics of the devices.

The present disclosure provides a method for manufacturing a semiconductor device, which is capable of suppressing degradation in characteristics of devices due to a leaked laser beam. In addition, the present disclosure provides a semiconductor wafer, which is capable of suppressing degradation in characteristics of devices due to a leaked laser beam.

According to an aspect of the present disclosure, a method for manufacturing a semiconductor device includes: preparing a processed wafer that includes a gallium nitride wafer containing a single crystal of gallium nitride and an epitaxial layer containing a single crystal of gallium nitride and layered on the gallium nitride wafer, in which the processed wafer has a front surface adjacent to the epitaxial layer and a back surface adjacent to the gallium nitride wafer; forming a front surface-side device-constituent part constituting a part of a device in a portion of the processed wafer adjacent to the front surface; forming a modified layer extending in a direction along the front surface in an inside of the processed wafer by applying a laser beam on a side of the back surface of the processed wafer so as to irradiate the inside of the processed wafer with the laser beam; and dividing the processed wafer at the modified layer into a device constituent wafer including the front surface and a back-surface side wafer including the back surface. In the preparing of the processed wafer, the processed wafer includes a reflective layer for reflecting the laser beam in the epitaxial layer and at a position separated from a planned formation position, where the modified layer is to be formed, toward the front surface of the processed wafer by a predetermined distance. The reflective layer includes a layer having a refractive index different from that of the single crystal of the gallium nitride of the epitaxial layer.

In such a method, the processed wafer is formed with the reflective layer at the position adjacent to the front surface than the modified layer. Therefore, when the modified layer is formed by applying the laser beam, the reflective layer can reflect a laser beam leaking from the planned formation position toward the front surface of the processed wafer. Therefore, as compared with a case where the reflective layer is not formed, the arrival of the laser beam to the front surface-side device-constituent part can be suppressed.

Further, the reflective layer for reflecting the laser beam may not absorb energy of the laser beam. Alternatively, the reflective layer may less absorb the energy of the laser beam than the laser absorbing layer of the relevant technology. Therefore, the heat generation due the absorption of the laser beam at the laser absorbing layer as in the relevant technology can be suppressed or avoided. As a result, deterioration of characteristic of the device due to the leaked laser beam can be suppressed.

According to an aspect of the present disclosure, a semiconductor wafer is used for a laser slicing process for dividing at a modified layer that is to be formed by irradiation with a laser beam. That is, the semiconductor wafer is before being subjected to the laser slicing process. The semiconductor wafer includes: a gallium nitride wafer containing a single crystal of gallium nitride; an epitaxial layer disposed on the gallium nitride wafer and containing a single crystal of gallium nitride, in which the gallium nitride and the epitaxial layer provide a layered body, and the layered body has a front surface adjacent to the epitaxial layer and a back surface adjacent to the gallium nitride wafer; a front surface-side device-constituent part disposed in a portion of the layered body adjacent to the front surface, the front surface-side device constituent part constituting a part of a device; and a reflective layer disposed in an inside of the epitaxial layer to extend in a planar direction along the front surface of the layered body. The reflective layer has a refractive index different from a refractive index of the single crystal of gallium nitride of the epitaxial layer.

In the laser slicing process, the modified layer extending in an inside of the layered body in a planar direction along the front surface is formed by applying the laser beam from the back surface side so that the inside of the layered body is irradiated with the laser beam. In this case, the reflective layer is provided in the layered body at the position closer to the front surface than the planned formation position of the modified layer.

As such, when the modified layer is formed by applying the laser beam, the laser beam leaking from the planned formation position of the modified layer toward the front surface of the layered body can be reflected. Therefore, as compared with a case where the reflective layer is not formed, the arrival of the laser beam to the front surface-side device-constituent part can be suppressed.

Further, the reflective layer for reflecting the laser beam may not absorb energy of the laser beam. Alternatively, the reflective layer may less absorb the energy of the laser beam than the laser absorbing layer of the relevant technology. Therefore, the heat generation due the laser absorption of the laser beam at the laser absorbing layer as in the relevant technology can be suppressed or avoided. As a result, deterioration of characteristic of the device due to the leaked laser beam can be suppressed.

Embodiments of the present disclosure will be described hereinafter with reference to the drawings. In the embodiments described hereinafter, the same or equivalent parts will be designated with the same reference numerals, and descriptions thereof will not be repeated.

First Embodiment

First, the outline of a method for manufacturing a semiconductor device according to the present embodiment will be described. In the manufacturing method, a substrate preparation process, an epitaxial process, a front surface-side device-forming process, a laser slicing process, a flattening process, a back surface-side device-forming process, and a dicing process are performed in this order.

In the substrate preparation process, as shown in FIG. 1A, a bulk wafer-shaped base material substrate 1 containing a GaN single crystal is prepared. The base material substrate 1 is also called a free-standing GaN substrate, a bulk GaN substrate, or a GaN wafer. The base material substrate 1 has a front surface 1a and a back surface 1b opposite to the front surface 1a in a thickness direction of the base material substrate 1. For example, the base material substrate 1 is doped with a conductive type impurity such as silicon, oxygen, or germanium, and has an impurity concentration of $1 \times 10^{18}$ cm$^{-3}$ or higher. The thickness of the base material substrate 1 is, for example, about 400 micrometres (μm). In the base material substrate 1, the front surface 1a is a gallium surface, and the back surface 1b is a nitrogen surface.

Figure 1B:
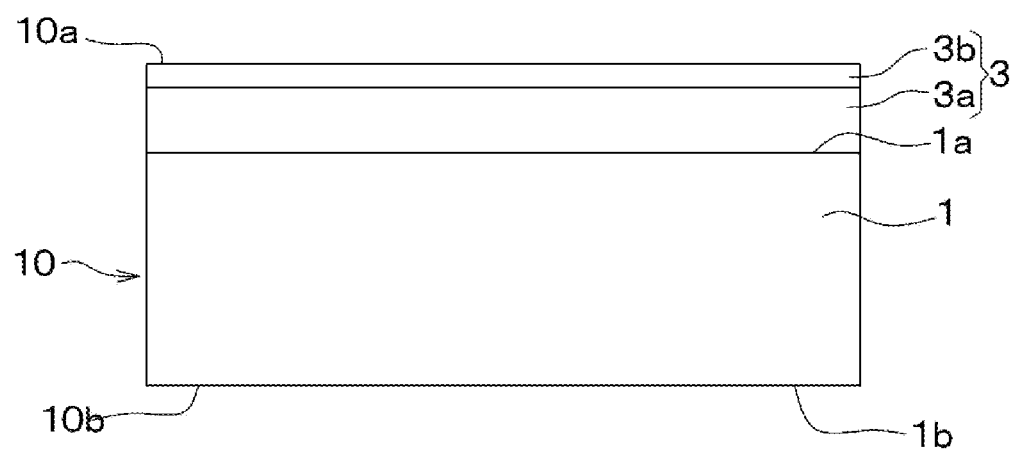
FIG. 1B is a cross-sectional view illustrating the manufacturing process for the semiconductor device subsequent to FIG. 1A.

In the epitaxial process, as shown in FIG. 1B, a GaN single crystal is epitaxially grown on the front surface 1a of the base material substrate 1 to form an epitaxial layer 3 containing a GaN single crystal. As a result, a layered body in which the epitaxial layer 3 is layered on the front surface 1a of the base material substrate 1, that is, a processed wafer 10 is formed.

In the present embodiment, the epitaxial layer 3 includes an n$^+$ type epitaxial layer 3a layered on the base material substrate 1 and an n$^-$ type epitaxial layer 3b layered on the n$^+$ type epitaxial layer 3a. For example, the n$^+$ type epitaxial layer 3a is doped with a conductive type impurity such as silicon, oxygen, or germanium, and has an impurity concentration of $1 \times 10^{18}$ cm$^{-3}$ or higher. The n$^-$ type epitaxial layer 3b is doped with a conductive type impurity such as silicon, and has an impurity concentration of $1 \times 10^{18}$ cm$^{-3}$ or less.

Note that the n$^-$ type epitaxial layer 3b is a portion where a front surface-side device constituent part 11, which includes a diffusion layer 12 or the like as described later, is formed. The n$^+$ type epitaxial layer 3a is a portion for ensuring the thickness of a semiconductor chip S1, which will be described later. The thickness of the n$^+$ type epitaxial layer 3a and the thickness of the n$^-$ type epitaxial layer 3b may be arbitrary. In the present embodiment, for example, the n$^+$ type epitaxial layer 3a is thicker than the n$^-$ type epitaxial layer 3b so as to ensure the thickness of the semiconductor chip S1.

The processed wafer 10 has a front surface 10a on the epitaxial layer 3 side. The processed wafer 10 has a back surface 10b on the base material substrate 1 side. As described above, the front surface 1a of the base material substrate 1 is the gallium surface and the back surface 1b of the base material substrate 1 is the nitrogen surface. Therefore, the front surface 10a of the processed wafer 10 is the gallium surface and the back surface 10b of the processed wafer 10 is the nitrogen surface. As described above, the processed wafer 10 having the base material substrate 1 and the epitaxial layer 3 layered on the base material substrate 1 is prepared by the substrate preparation process and the epitaxial process.

Figure 1C:
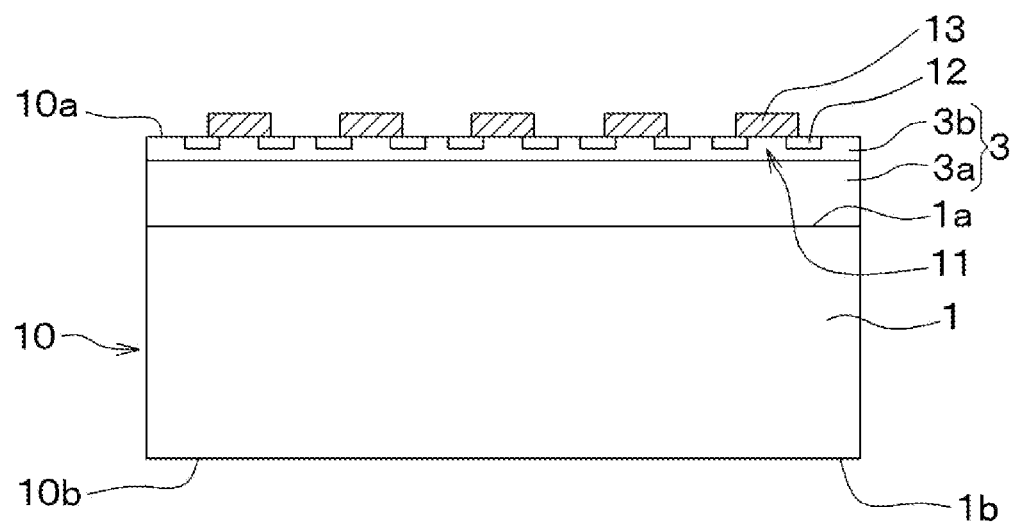
FIG. 1C is a cross-sectional view illustrating the manufacturing process for the semiconductor device subsequent to FIG. 1B.

In the front surface-side device-forming process, as shown in FIG. 1C, the front surface-side device constituent part 11 is formed in a portion of the processed wafer 10 adjacent to the front surface 10a. The front surface-side device constituent part 11 provides a part of a device. The front surface-side device constituent part 11 includes a functional layer, a conductive film, and an insulating film. Examples of the device include power devices such as vertical-type metal oxide semiconductor (MOS) transistors, optical semiconductor elements such as light emitting diodes, and semiconductor lasers. The front surface-side device constituent part 11 includes an impurity diffusion layer 12, a gate electrode 13, a surface electrode (not shown), a wiring pattern, a passivation film, and the like.

Figure 1D:
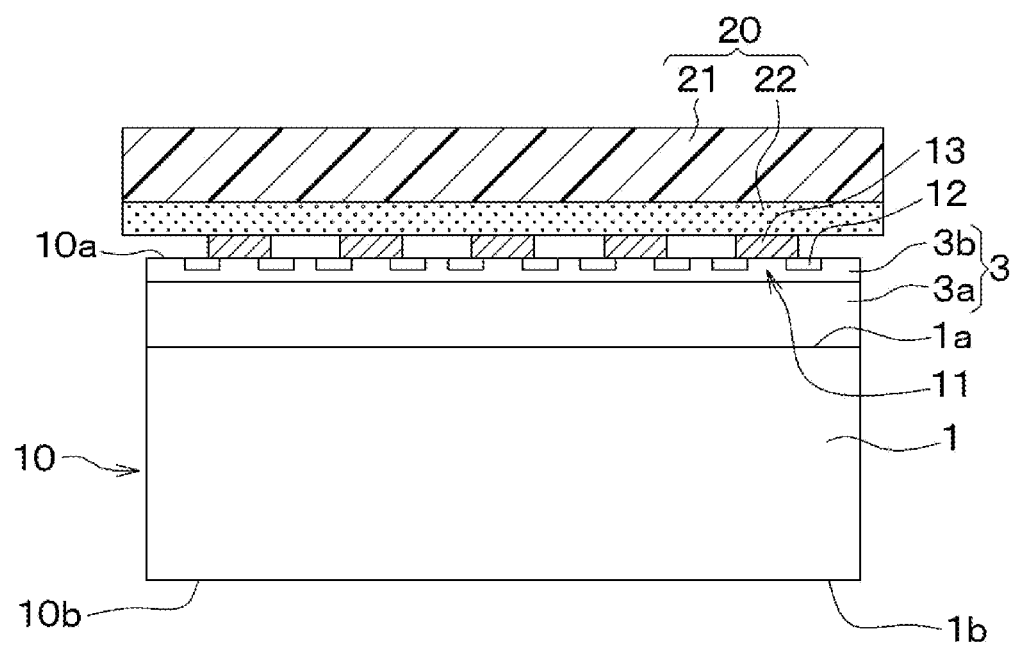
FIG. 1D is a cross-sectional view illustrating the manufacturing process for the semiconductor device subsequent to FIG. 1C.

In the laser slicing process, a laser slicing is performed. Specifically, as shown in FIG. 1D, a holding member 20 for holding the processed wafer 10 is fixed on the front surface 10a side of the processed wafer 10. The holding member 20 includes a base material 21 and an adhesive 22 whose adhesive force can be changed.

Figure 1E:
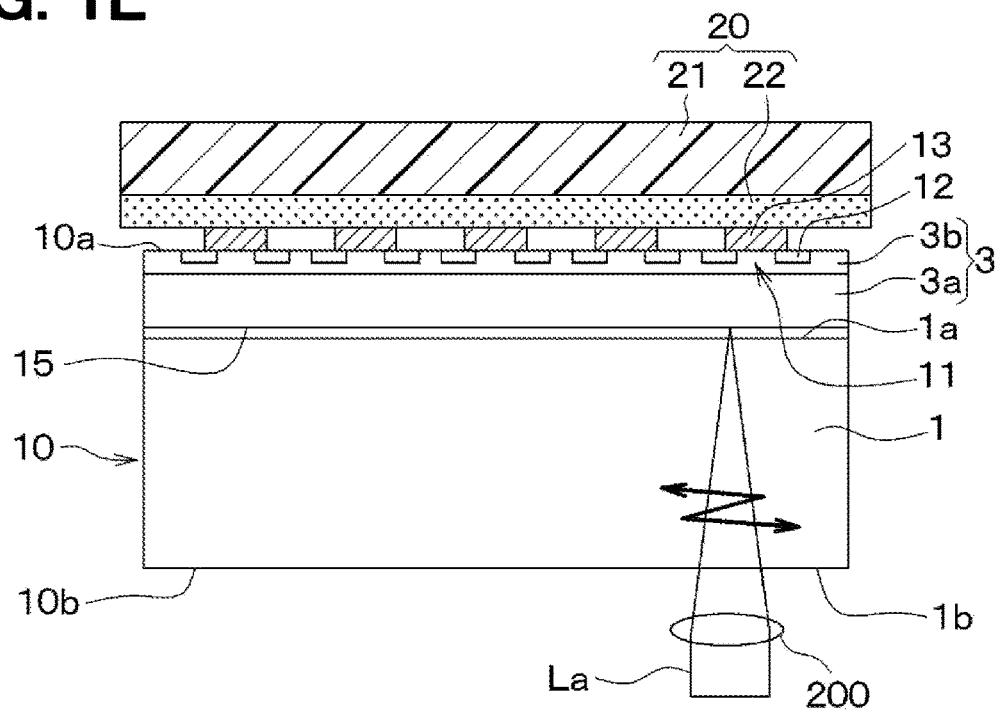
FIG. 1E is a cross-sectional view illustrating the manufacturing process for the semiconductor device subsequent to FIG. 1D.

In this state, as shown in FIG. 1E, a laser beam La is applied to the processed wafer 10 from the back surface 10b side of the processed wafer 10. Thus, a modified layer 15 is formed inside the processed wafer 10 as an inside of the processed wafer 10 is irradiated with the laser beam La applied from the back surface 10b side. The laser beam La applied is a pulse laser. In this case, a laser device (not shown) is used. The laser device includes a laser light source that oscillates a laser beam La, a displaceable stage on which the processed wafer 10 is placed, and the like. The laser device further includes a condenser lens 200 for condensing the laser beam La. The laser device oscillates the laser beam La as a pulse of a constant time. The laser beam La has a wavelength that is transparent to the processed wafer 10. An optical system is set so that a focal point of the applied laser beam La is positioned at a predetermined depth from the back surface 10b of the processed wafer 10 inside the processed wafer 10.

In forming the modified layer 15, the laser beam La is applied via the condensing lens 200 while adjusting the position of the stage or the like so that the focal point of the laser beam La is moved relative to the processed wafer 10 along a planar direction of the processed wafer 10. At the focal point, the GaN crystal absorbs the laser beam La by the effect of multiphoton absorption or the like. As a result, a modified portion in which Ga is precipitated by a reforming reaction represented by the following formula (1) is generated.

$$\text{GaN} \rightarrow \text{Ga (solid)} + \tfrac{1}{2}\text{N}_2 \text{ (gas)} \qquad (1)$$

As the laser beam La is applied so that the focal point of the laser beam La moves relative to the processed wafer 10 along the planar direction, the modified portions generated at the focal points are connected in a plane. As a result, the modified layer 15 having a shape extending along the planar direction of the processed wafer 10 is formed. The planar direction is a direction parallel to the front surface 10a of the processed wafer 10.

Figure 1F:
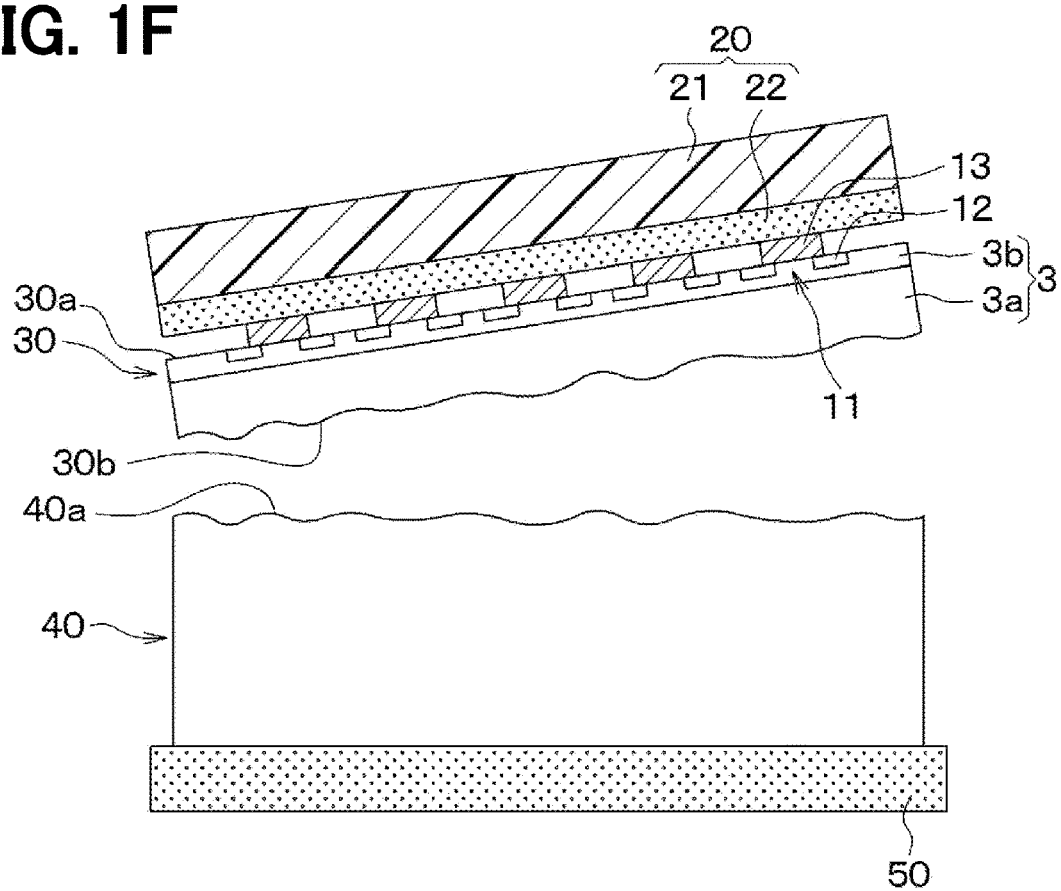
FIG. 1F is a cross-sectional view illustrating the manufacturing process for the semiconductor device subsequent to FIG. 1E.

Subsequently, as shown in FIG. 1F, the processed wafer 10 is divided at the modified layer 15, as a starting point of dividing, into a device constituent wafer 30 including the front surface 10a of the processed wafer 10 and a back surface-side wafer 40 including the back surface 10b of the processed wafer 10.

In this case, a support member 50 is fixed to the back surface 10b of the processed wafer 10. The support member 50 has, for example, a base material and an adhesive whose adhesive force can be changed. Then, in a state where the holding member 20 and the support member 50 are held, a force for separating the processed wafer 10 entirely in the thickness direction is applied to the processed wafer 10 under appropriate conditions. The appropriate conditions include, for example, heating the entirety of the processed wafer 10 at the temperature equal to or higher than a melting point of Ga metal (i.e., 38 degrees Celsius). In this way, the processed wafer 10 is divided.

The surface of the device constituent wafer 30 on which the front surface-side device constituent part 11 is formed is referred to as a front surface 30a of the device constituent wafer 30. The surface of the device constituent wafer 30 from which the rear surface-side wafer 40 is separated is referred to as a back surface 30b of the device constituent wafer 30. The surface of the rear surface-side wafer 40 from which the device constituent wafer 30 is separated is referred to as a front surface 40a of the rear surface-side wafer 40. Each of the back surface 30b of the device constituent wafer 30 and the front surface 40a of the back surface-side wafer 40 is an uneven surface having a height difference of several micrometres (μm) to several tens of μm.

Figure 1G:
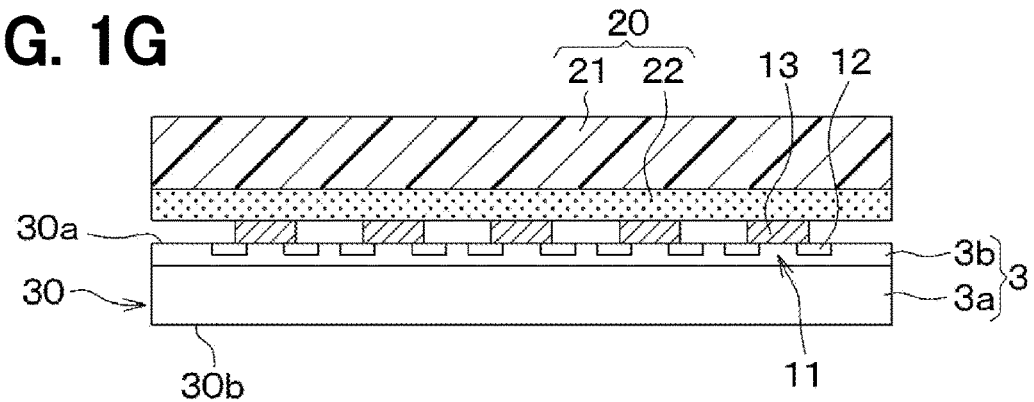
FIG. 1G is a cross-sectional view illustrating the manufacturing process for the semiconductor device subsequent to FIG. 1F.

In the flattening process, as shown in FIG. 1G, a part of the device constituent wafer 30 adjacent to the back surface 30b is removed and the back surface 30b of the device constituent wafer 30 is flattened. The flattening is performed by grinding and polishing such as by a chemical mechanical polishing (CMP) technique.

Figure 1H:
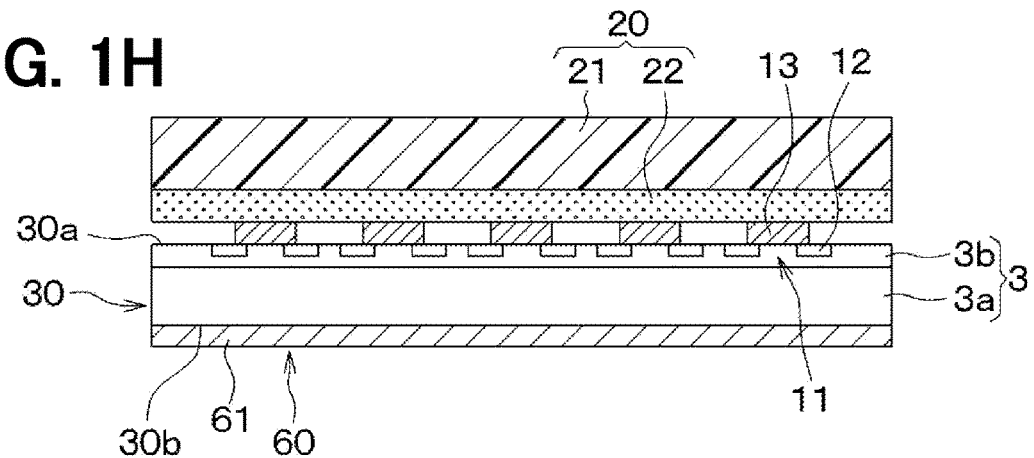
FIG. 1H is a cross-sectional view illustrating the manufacturing process for the semiconductor device subsequent to FIG. 1G.

In the back surface-side device-forming process, as shown in FIG. 1H, a back surface-side device constituent part 60 is formed on the back surface 30b of the device constituent wafer 30. The back surface-side device constituent part 60 provides another part of the device. The back surface-side device constituent part 60 includes a metal film 61 or the like that constitutes a back surface electrode. Thereafter, the holding member 20 is separated from the device constituent wafer 30.

Figure 1I:
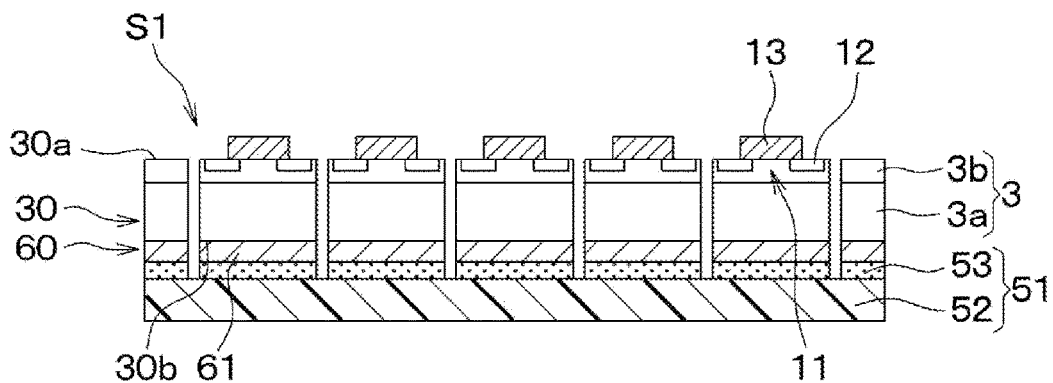
FIG. 1I is a cross-sectional view illustrating the manufacturing process for the semiconductor device subsequent to FIG. 1H.

In the dicing process, as shown in FIG. 1I, the device constituent wafer 30 is diced into multiple chips S1. In this case, a holding member 51 is fixed to the rear surface 30b of the device constituent wafer 30. The holding member 51 has a base material 52 and an adhesive 53 whose adhesive strength can be changed. In this state, the device constituent wafer 30 is cut by a blade dicing technique, a laser ablation technique, a stealth dicing technique, or the like. Note that the dicing process may be performed prior to the laser slicing process, the back surface-side device-forming process, and the flattening process.

Figure 1J:
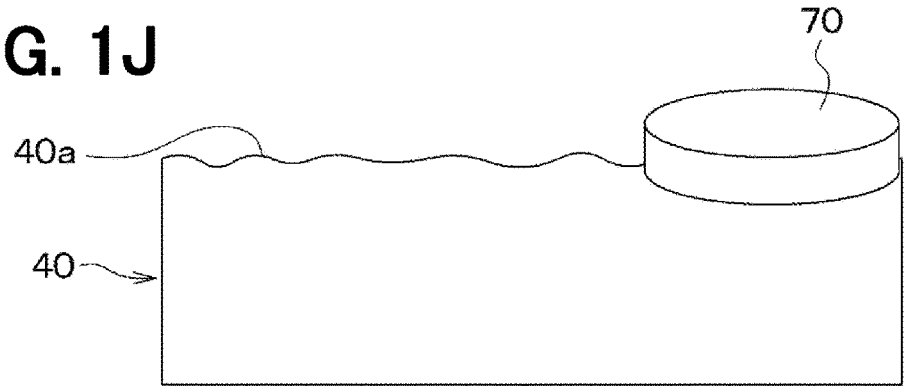
FIG. 1J is a cross-sectional view illustrating the manufacturing process for the semiconductor device subsequent to FIG. 1I.

In the manufacturing method for the semiconductor device of the present embodiment, a recycling process is performed. In the recycling process, as shown in FIG. 1J, the front surface 40a of the back surface-side wafer 40, which is separated from the back surface 30b of the device constituent wafer 30 in the laser slicing process, is flattened. The flattening is performed by grinding and polishing, for example, by the CMP technique using a polishing device 70. As a result, the back surface-side wafer 40 is recycled and used as the base material substrate 1 in the substrate preparation process. By repeatedly using the base material substrate 1 in this manner, the costs for the substrate for forming the device per time can be reduced.

Next, a planned formation position where the modified layer 15 is to be formed and the epitaxial process will be described in detail.

Figure 2:
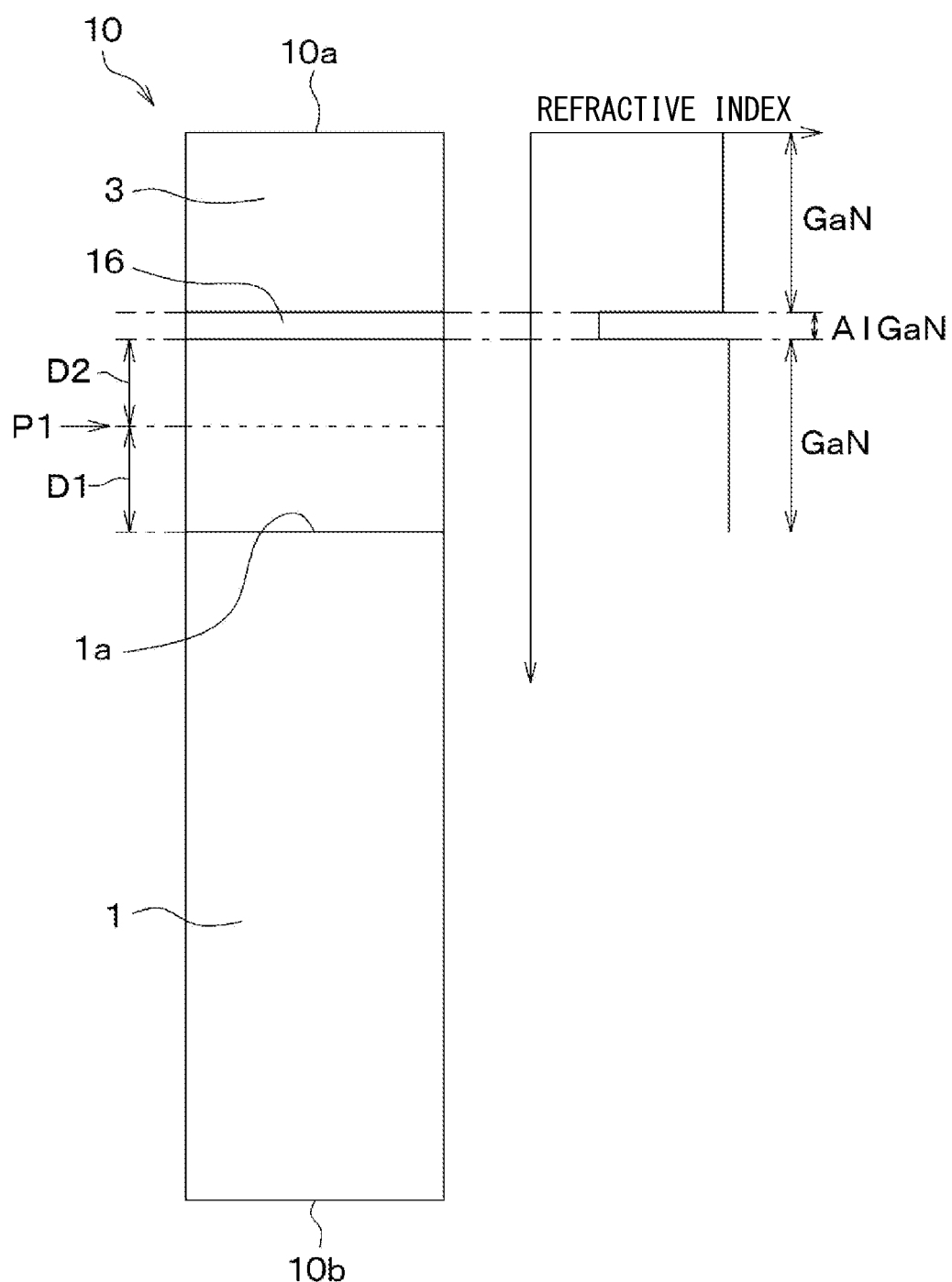
FIG. 2 is a cross-sectional view, with an explanatory diagram of a refractive index, of a processed wafer after an epitaxial process.

As shown in FIG. 2, in the present embodiment, a planned formation position P1 of the modified layer 15 where the modified layer 15 is to be formed in the laser slicing process is separated by a first distance D1 from an interface between the base material substrate 1 and the epitaxial layer 3 in the processed substrate 10. That is, the planned formation position P1 is separated by the first distance D1 from the front surface 1a of the base material substrate 1 toward the front surface 10a of the processed substrate 10. The first distance D1 is preferably set to correspond to the thickness of the portion removed when flattening the front surface 40a of the back surface-side wafer 40 in the recycling process.

For example, by grinding and polishing in the recycling process, a portion of the back surface-side wafer 40 on the front surface 40a side having a thickness of about 20 μm from the front surface 40a is removed. In this case, the first distance D1 is set to 20 μm. As a result, when the front surface 40a of the back surface-side wafer 40 is flattened, the reduction in the thickness of the base material substrate 1 can be suppressed. Note that the first distance D1 is not limited to 20 μm, and may be set to another distance within a range of greater than 0 μm and 30 μm or less.

In the epitaxial process, as shown in FIG. 2, a reflective layer 16 is formed inside the epitaxial layer 3. The reflective layer 16 includes a layer having a refractive index different from that of the GaN single crystal, thereby reflecting the laser beam La applied in the laser slicing process, which is described hereinabove. The laser beam La is incident on the processed wafer 10 substantially perpendicularly. This reflection includes not only specular reflection but also diffuse reflection. The diffuse reflection is also called irregular reflection or scattering.

In the present embodiment, the reflective layer 16 is composed of only one AlGaN layer having a refractive index different from that of the GaN single crystal. The AlGaN layer is a layer made of aluminum gallium nitride (hereinafter referred to as AlGaN). The reflective layer 16 reflects the laser beam at the interface between the portion of the epitaxial layer 3 made of GaN and the reflective layer 16.

Figure 3:
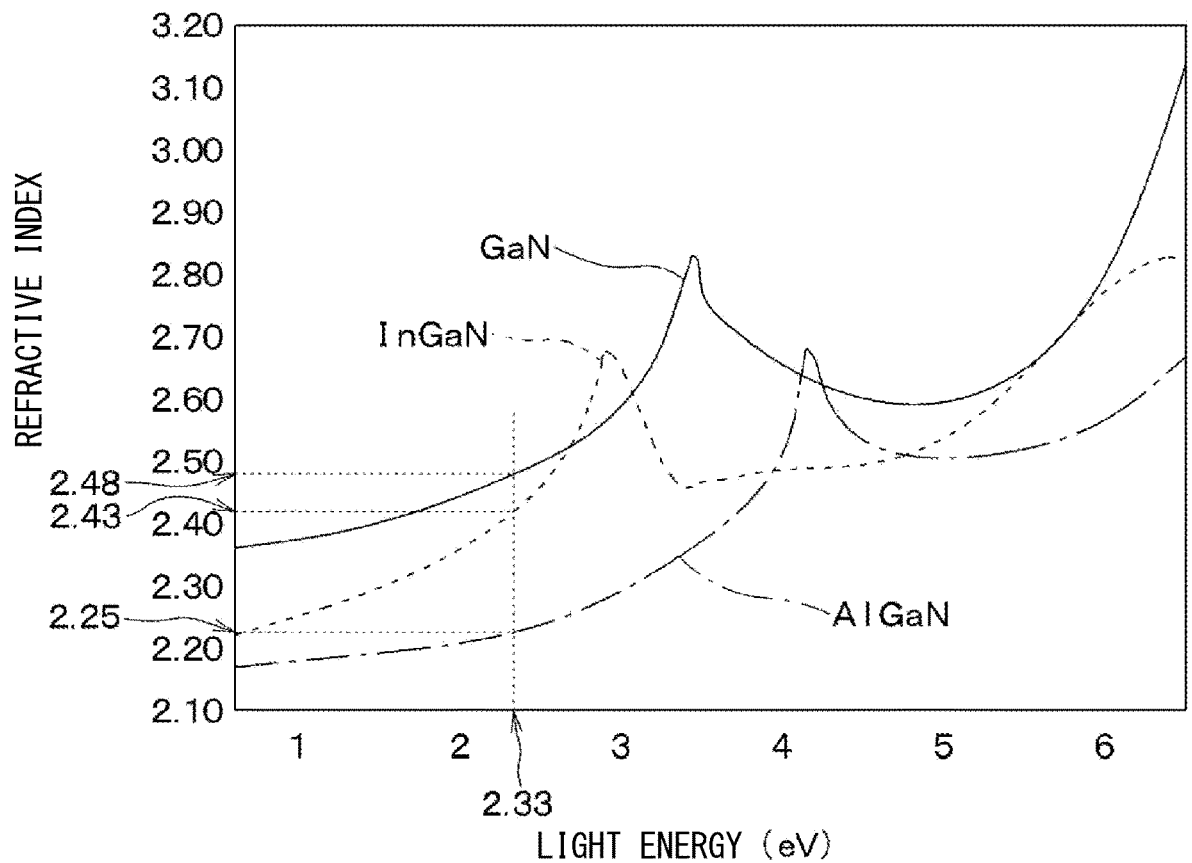
FIG. 3 is a diagram illustrating the relationship between light energy and a refractive index of each of GaN, AlGaN, and InGaN.

As shown in FIG. 3, AlGaN has a different refractive index with respect to that of GaN. The refractive index of AlGaN is lower or higher than that of GaN depending on the energy of the laser beam. For example, when the wavelength ($\lambda$) of the laser beam is 532 nm ($\lambda$=532), the energy (E) of the laser beam is 2.33 eV (E=2.33 eV). In FIG. 3, a horizontal axis represents the energy of the laser beam, and a vertical axis represents a refractive index. In this case, as shown in FIG. 3, values along the vertical axis at the intersections between a vertical dashed line at the energy of 2.33 and respective lines, such as a solid line, dashed line and one-dot chain line, indicate refractive indexes of respective materials. Thus, the refractive index of GaN is 2.48, and the refractive index of AlGaN is 2.25. Note that the refractive index of AlGaN shown in FIG. 3 is the refractive index of $Al_xGa_{1-x}N$ in which x is 0.25 (x=0.25). Assumed that the refractive index of AlGaN is defined as $N_1$, and the refractive index of GaN is defined as $N_2$. A reflectance R at the interface between the portion made of GaN and the reflective layer 16 when the wavelength $\lambda$ is 532 nm ($\lambda$=532) is given by the following equation 1. The reflectance R is the ratio of the intensity of the reflected wave to the intensity of the incident wave. In the following, the value of the reflectance R is given in percentage.

$$R = \left\{\frac{N_1 - N_2}{N_1 + N_2}\right\}^2 \sim 0.2\% \qquad \text{[Eq. 1]}$$

The formation position of the reflective layer 16 is separated from the planned formation position P1 of the modified layer 15 toward the front surface 10a of the processed wafer 10 by a second distance D2 as a predetermined distance. The second distance D2 is preferably set to be equal to or less than the thickness of the portion of the device constituent wafer 30 to be removed in the flattening process, which is described hereinabove. The second distance D2 is set to, for example, 10 μm or more and 30 μm or less.

In the epitaxial process, a GaN layer having a total thickness of the first distance D1 and the second distance D2 from the front surface 1a of the base material substrate 1 is formed. Then, an AlGaN layer having a thickness of, for example, 10 nm or more and 30 nm or less, preferably about 20 nm, is formed. Thereafter, a GaN layer having a thickness of 10 μm or more and 200 μm or less is formed. The GaN layer is a layer composed of single crystals of GaN. The GaN layer and the AlGaN layer are formed by continuously forming a film while changing conditions, such as types of source gas, in the same epitaxial growth apparatus, using a hydride vapor phase epitaxy (HVPE) technique. However, since the formation of the AlGaN layer requires precise control of the thickness of a thin film, a metal organic chemical vapor deposition (MO-CVD) technique or a molecular beam epitaxy (MBE) technique, which enables more precise control of the film thickness, may be used instead of the HVPE technique.

Figure 5:
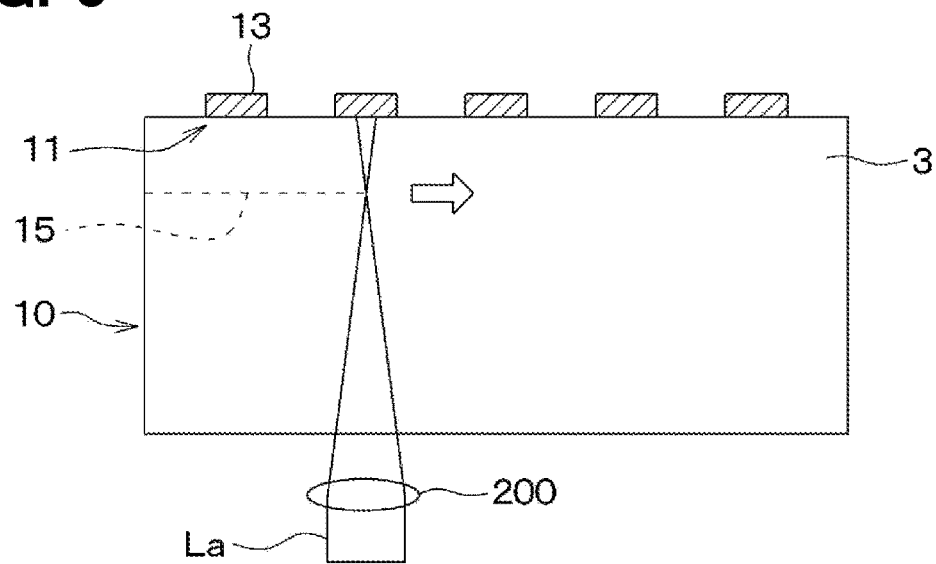
FIG. 5 is a cross-sectional view illustrating a laser slicing process in a manufacturing method for a semiconductor device of a comparative example 1.
Figure 6:
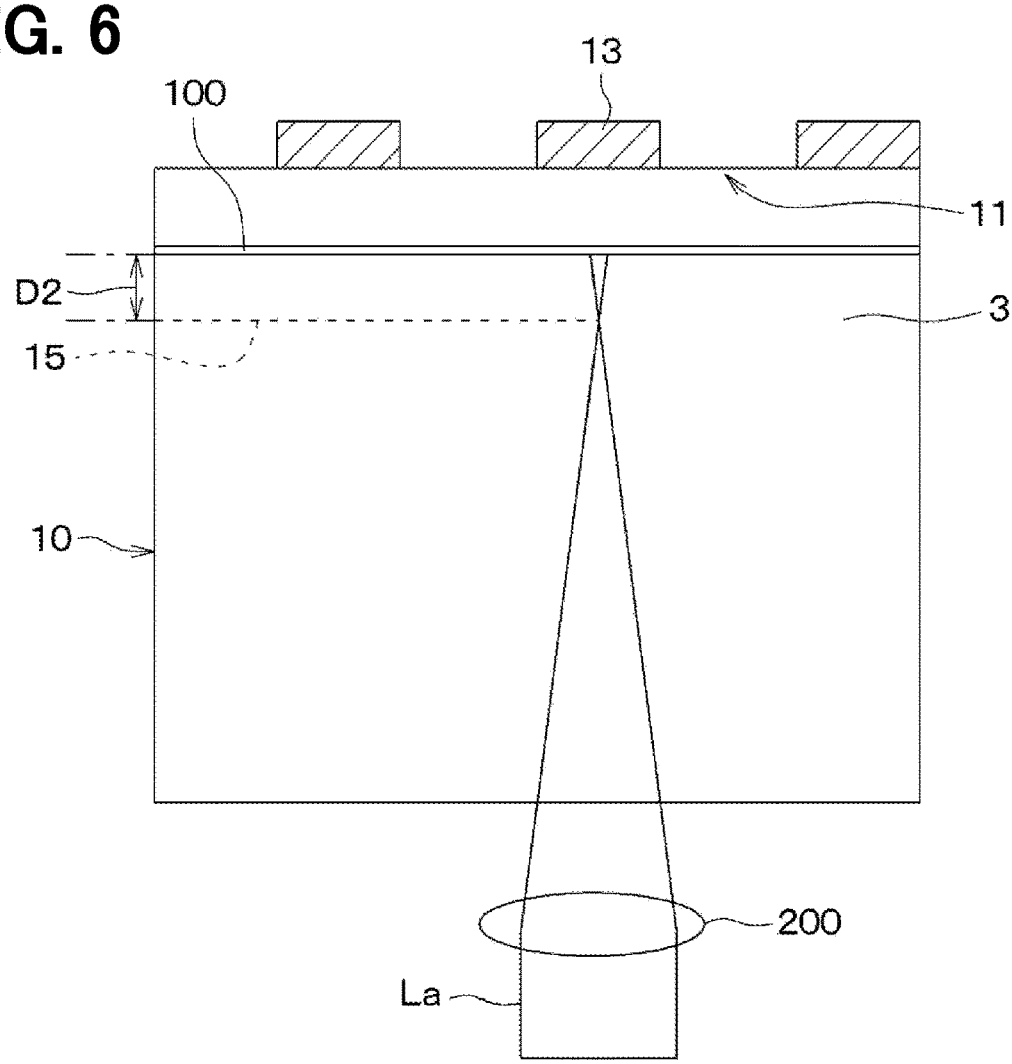
FIG. 6 is a cross-sectional view illustrating a laser slicing process in a manufacturing method for a semiconductor device of a comparative example 2.

Next, effects of the present embodiment will be described in comparison with comparative examples 1 and 2 shown in FIGS. 5 and 6. As shown in FIG. 5, the comparative example 1 differs from the first embodiment in that the reflective layer 16 is not formed inside the epitaxial layer 3 in the epitaxial process. Other configurations of the manufacturing method for the semiconductor device of the comparative example 1 are similar to those of the first embodiment. As shown in FIG. 6, the comparative example 2 differs from the first embodiment in that an absorption layer 100 that absorbs the energy of the laser light is formed inside the epitaxial layer 3, in place of the reflection layer 16. The formation position of the absorption layer 100 is the same as the formation position of the reflective layer 16 of the first embodiment. Other configurations of the manufacturing method for the semiconductor device of the comparative example 2 are similar to those of the first embodiment.

Figure 4:
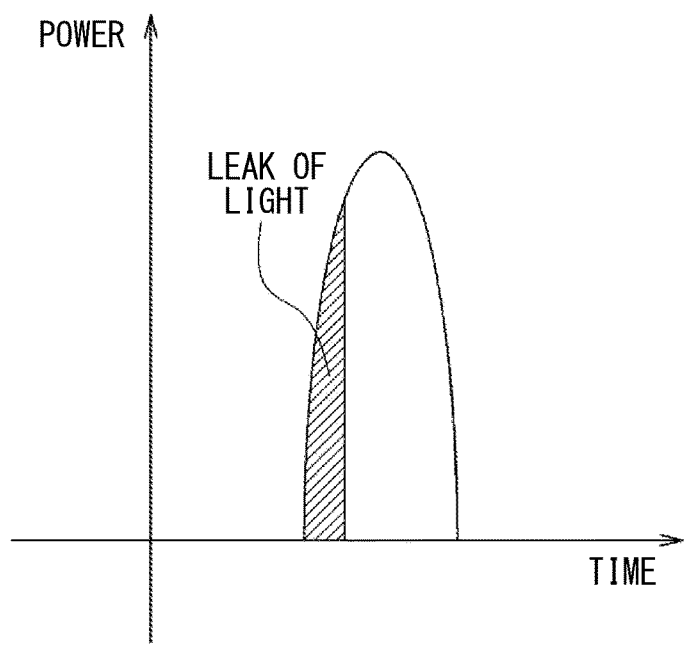
FIG. 4 is a diagram illustrating a change in output with respect to an application time of a laser beam applied in a laser slicing process.

In the laser slicing process described hereinabove, the laser beam emitted is a pulsed laser beam. FIG. 4 shows a schematic waveform of the output of the pulsed laser beam with respect to time. The pulse width is several hundred ps to several tens ns. At the beginning of the pulse width, a certain period of time is required for the GaN crystal to undergo the reaction of the chemical formula (1). During this period of time, the laser beam passes through the focal point. The laser beam leaks toward the front-side device-constituent part 11. That is, the laser beam during this period of time is leakage light.

In the comparative example 1 shown in FIG. 5, the leakage light for such a short period of time is absorbed by the front surface-side device-constituent part 11, for example, electrodes such as the gate electrode 13 and the like. That is, the energy of the laser beam is absorbed in the front surface-side device-constituent part 11 and instantaneously converted into heat energy. The heat energy induces a melting of the electrode 13, a local annealing effect of the GaN crystal, and the like. These effects can adversely affect characteristics of the device.

In the comparative example 2, as shown in FIG. 6, the absorption layer 100 absorbs the leakage light, thereby suppressing the leakage light from reaching the front surface-side device-constituent part 11. However, there is a possibility that a new modified layer is formed in the epitaxial layer 3, which is a GaN crystal layer, due to the absorption layer 100 absorbing the laser beam and generating heat. Thus, the heat generated by absorption of the laser beam La in the absorption layer 100 may adversely affect the GaN crystal layer forming the device, and adversely affect the characteristics of the device.

Figure 7:
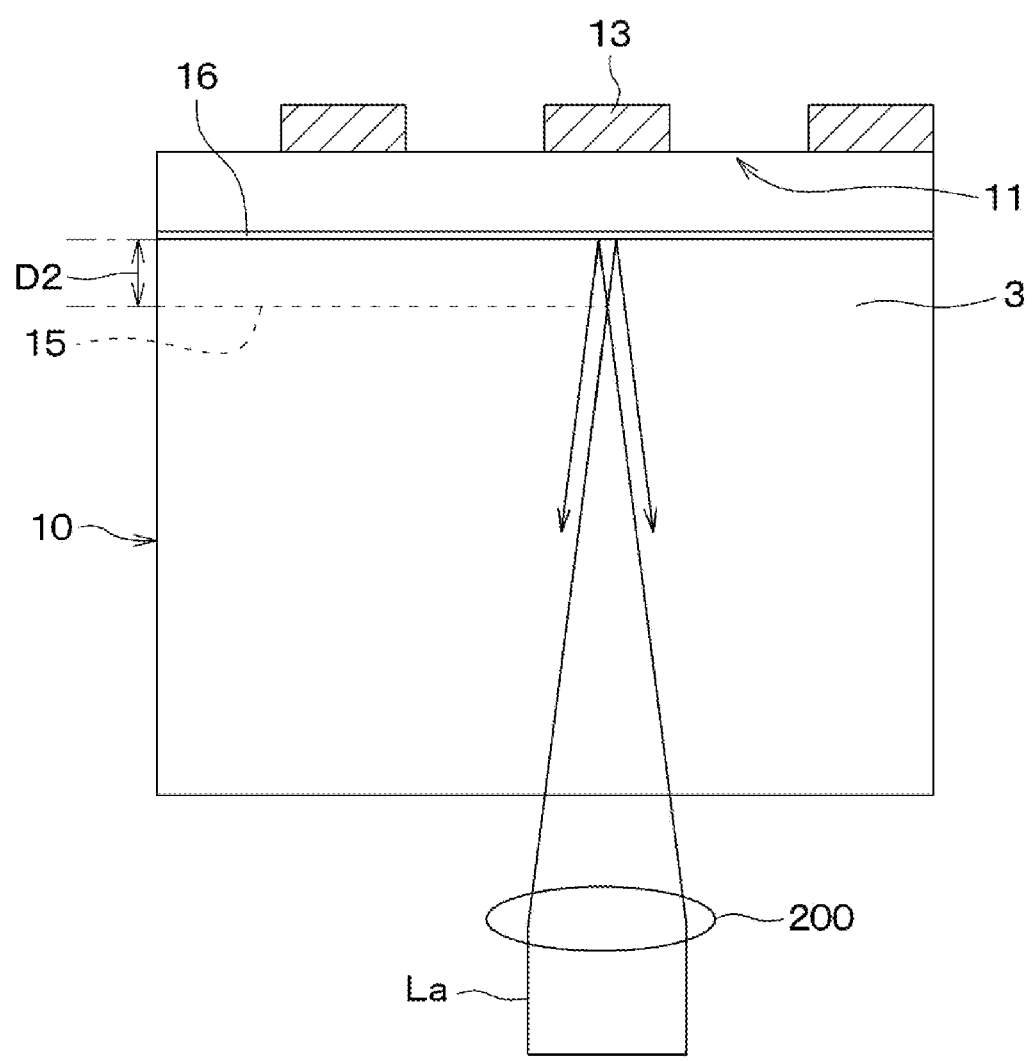
FIG. 7 is a cross-sectional view illustrating a laser slicing process in a manufacturing method for a semiconductor device according to the first embodiment.

In the first embodiment, on the other hand, the reflective layer 16 is formed at the position closer to the front surface 10a of the processed wafer 10 than the planned formation position P1 where the modified layer 15 is to be formed, as shown in FIG. 2. Therefore, in the laser slicing process, leakage light can be reflected by the reflective layer 16, as shown in FIG. 7. As such, as compared to the case where the reflective layer 16 is not formed, it is possible to suppress the arrival of leakage light to the front surface-side device-constituent part 11.

According to such a configuration, the reflective layer 16 reflects the laser beam La and does not absorb the energy of the laser beam La, or less absorbs the energy of the laser beam La than the absorption layer 100 of the comparative example 2. Therefore, it is possible to suppress or avoid the heat generation due to the absorption of the laser beam that occurs in the comparative example 2. As a result, it is possible to suppress the deterioration of the device characteristics due to the leakage of the laser beam.

Figure 8:
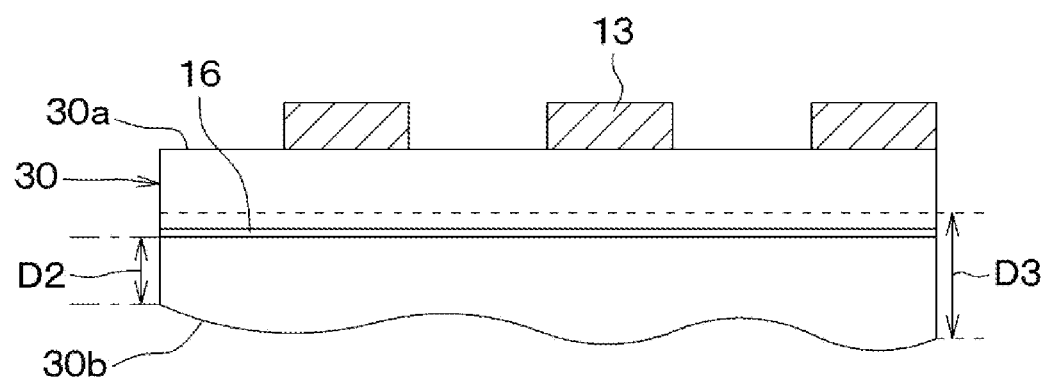
FIG. 8 is a cross-sectional view of a device-constituent wafer after a laser slicing process in a manufacturing method for a semiconductor device according to the first embodiment.

Moreover, the first embodiment further achieves the following effects. The formation position of the reflective layer 16 is separated from the planned formation position P1 of the modified layer 15 by the second distance D2 toward the front surface 10a of the processed wafer 10. That is, as shown in FIG. 8, the formation position of the reflective layer 16 is separated by the second distance D2 from the rear surface 30b of the device constituent wafer 30 divided by the laser slicing process. The second distance D2 is set shorter than a thickness D3 of the portion to be removed when the back surface 30b of the device constituent wafer 30 is flattened in the flattening process described hereinabove. For example, when the thickness D3 of the portion to be removed is approximately 20 μm to 25 μm, the second distance D2 is set to 15 μm.

Figure 9:
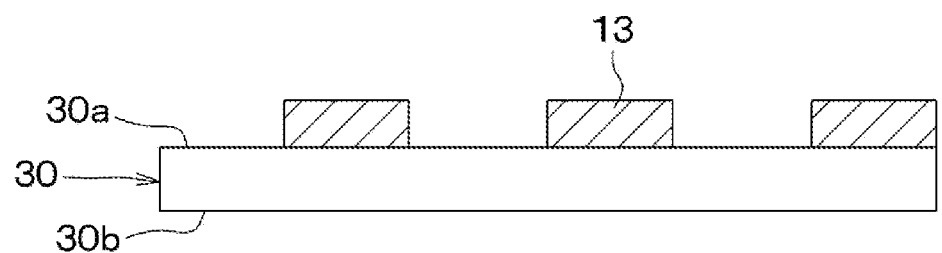
FIG. 9 is a cross-sectional view of the device-constituent wafer after a flattening process in the manufacturing method for the semiconductor device according to the first embodiment.

As a result, as shown in FIG. 9, the reflective layer 16 is also removed when the portion of the device constituent wafer 30 adjacent to the back surface 30b is removed in the flattening process. That is, the reflective layer 16 does not remain in the device after manufactured.

The reflective layer 16 may be provided by one InGaN layer, in place of one AlGaN layer, as long as the reflective layer 16 has a refractive index different from that of the GaN single crystal. The InGaN layer is a layer made of indium gallium nitride (hereinafter referred to as InGaN). As shown in FIG. 3, the refractive index of InGaN is lower or higher than that of GaN depending on the energy of the laser beam. When the wavelength (λ) of the laser light is 532 nm (λ=532), that is, when the energy (E) of the laser beam is 2.33 eV (E=2.33), the refractive index of GaN is 2.48, whereas the refractive index of InGaN is 2.43. Also in the case where the reflective layer 16 is composed of only one InGaN layer, the reflective layer 16 reflects the laser beam La at the interface between the reflective layer 16 and the portion of the processed wafer 10 made of GaN.

Second Embodiment

The second embodiment differs from the first embodiment in the configuration of the reflective layer. Other configurations of the manufacturing method for the semiconductor device are similar to those of the first embodiment.

Figure 10:
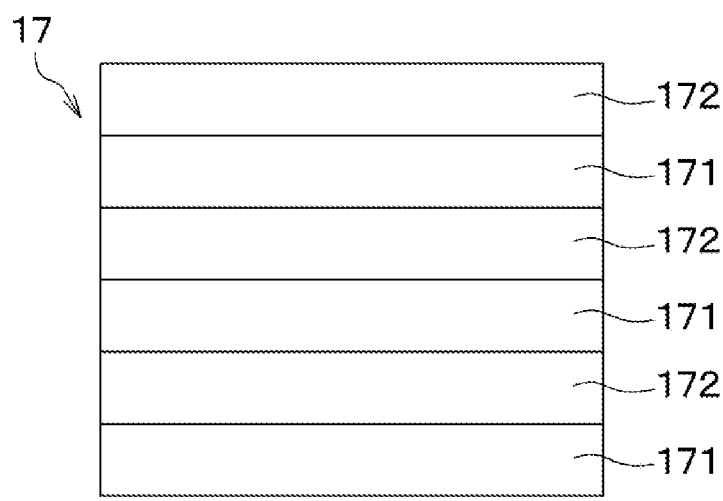
FIG. 10 is a cross-sectional view of a reflective layer formed on a processed wafer in a manufacturing method for a semiconductor device according to a second embodiment.

As shown in FIG. 10, a reflective layer 17 of the second embodiment is composed of a dielectric multilayer structure in which one AlGaN layer 171 and one GaN layer 172 are paired, and plural pairs of the AlGaN layer 171 and the GaN layer 172 are layered so that the AlGaN layers 171 and GaN layers 172 are alternately arranged. In one pair of AlGaN layer 171 and GaN layer 172, the AlGaN layer 171 is on the back surface 10b side of the processed wafer 10. In order to distinguish the outermost GaN layer 172 of the reflective layer 17 (uppermost GaN layer 172 in FIG. 10), which is disposed on the front surface side 10a of the processed wafer 10, from the epitaxial layer 3 of GaN, another AlGaN layer (not shown) or the like is formed on the front surface 10a side of the outermost GaN layer 172.

The AlGaN layer 171 corresponds to a first layer. The GaN layer 172 corresponds to a second layer having a refractive index different from that of the first layer. Assumed that the refractive index of the AlGaN layer 171 relative to the wavelength $\lambda$ of the laser beam La used on the laser slicing process is defined as $N_1$ and the refractive index of the GaN layer 172 relative to the wavelength $\lambda$ of the laser beam La used in the laser slicing process is defined $N_2$. The film thickness of the AlGaN layer 171 is defined as $d_1$, and the film thickness of the GaN layer 172 is defined as $d_2$. In this case, the film thickness $d_1$ of the AlGaN layer 171 and the film thickness $d_2$ of the AlGaN layer 171 are set so as to satisfy the following equations.

$$d_1 = \frac{\lambda}{4N_1}$$ [Eq. 2]

$$d_2 = \frac{\lambda}{4N_2}$$ [Eq. 3]

For example, when the wavelength $\lambda$ of the laser beam is 532 nm ($\lambda$=532), the refractive index $N_1$ of the AlGaN layer 171 is 2.25 ($N_1$=2.25) and the refractive index $N_2$ of the GaN layer 172 is 2.48 ($N_2$=2.48). Thus, the film thickness $d_1$ of the AlGaN layer 171 is set to 59.1 nm ($d_1$=59.1), and the film thickness $d_2$ of the GaN layer 171 is set to 54.3 nm ($d_2$=54.3).

As described above, since the AlGaN layers 171 and the GaN layers 172 are paired and alternately layered, a reflectance higher than that of the first embodiment can be obtained due to the effect of the dielectric multilayer film. For example, when the number of the pairs is five or more and twenty or less, a sufficiently high reflectance can be obtained.

Also in the present embodiment, in the epitaxial process, the GaN layer having the thickness of the sum of the first distance L1 and the second distance L2 from the front surface 1a of the base material substrate 1 is formed. Thereafter, the AlGaN layers 171 and the GaN layers 172 each having the thicknesses described above are alternately formed. The formation of the reflective layer 17, that is, the formation of the AlGaN layers 171 and the GaN layers 172 is realized by continuously forming films while changing the conditions in the same epitaxial growth apparatus, using the HVPE technique. However, since the formation of the reflective layer 17 requires precise control of the thickness of the thin films, the MO-CVD technique or the MBE technique, which enables more precise film thickness control, may be used instead of the HVPE technique.

Figure 11:
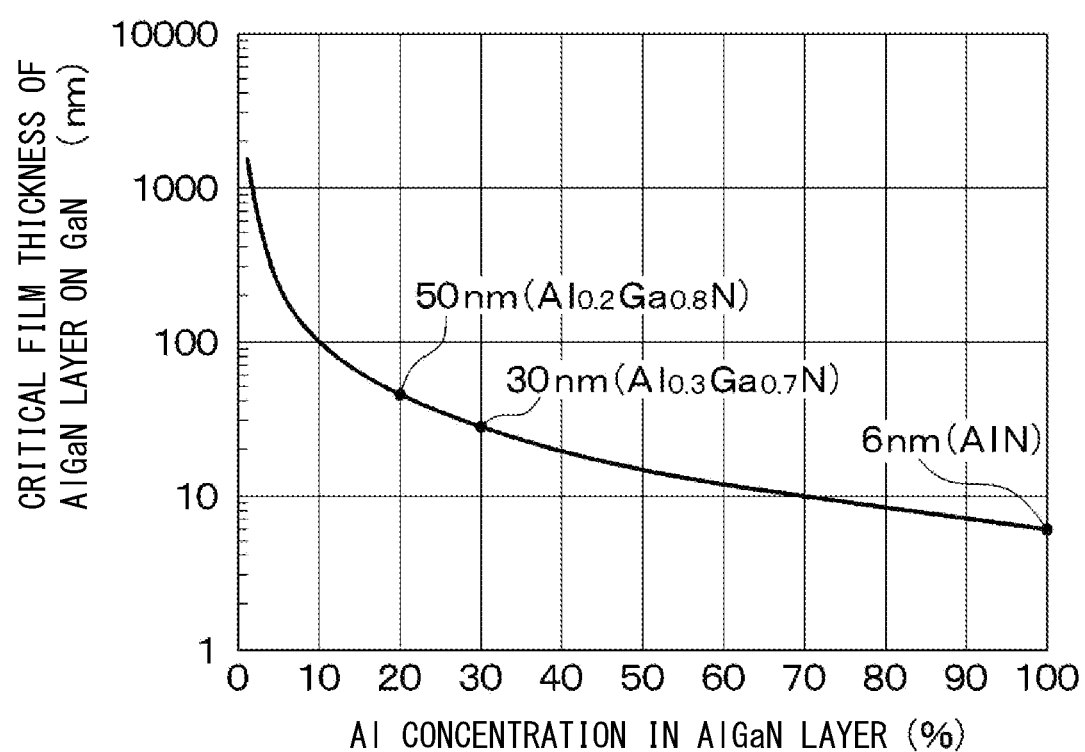
FIG. 11 is a diagram showing the relationship between an Al concentration and a critical film thickness of an AlGaN layer on GaN.

When an AlGaN layer (that is, an AlGaN film) is formed on GaN by an epitaxial growth method, the film thickness with which the AlGaN layer can grow normally is limited. The film thickness at the limit is called a critical film thickness. The critical film thickness of the AlGaN layer is determined by the Al content x (that is, Al concentration) in $Al_xGa_{1-x}N$. FIG. 11 shows an example of a calculation result about the relationship between the Al concentration and the critical film thickness of the AlGaN layer on GaN.

As shown in FIG. 11, the critical film thickness is about 6 nm when the Al concentration is 100% (that is, AlN). The critical film thickness increases as the Al concentration decreases from 100%. For example, the critical film thickness is about 97 nm when the Al concentration is 10%. Therefore, it is possible to form the AlGaN layer with the film thickness $d_1$ of 59.1 nm ($d_1$=59.1) as described above on the GaN layer.

Similarly, the critical film thickness of the GaN layer (that is, the GaN film) relative to AlGaN with the Al concentration of 10% is also about 97 nm. Therefore, it is possible to form the GaN layer with the film thickness d2 of 54.3 nm (d2=54.3) as described above on the AlGaN layer.

The difference of refractive index between AlGaN and GaN when the Al concentration is 10% is smaller than the difference of refractive index between AlGaN and GaN when the Al concentration is 25% in the first embodiment. However, even when the Al concentration is as low as 10%, it is possible to grow the AlGaN layers 171 and the GaN layers 172 while increasing the number of alternating layers of the AlGaN layers 171 and the GaN layers 172. Therefore, due to the effect of the dielectric multilayer film structure, a much higher reflectance can be obtained, as compared to the case where the Al concentration is 25% as in the first embodiment.

In the present embodiment, the film thickness $d_1$ of the AlGaN layer 171 and the film thickness $d_2$ of the AlGaN layer 171 are set so as to satisfy the equations 2 and 3. However, as long as the reflective layer 17 can reflect the laser beam La, it is not always necessary to satisfy the equations 2 and 3 described above.

In the present embodiment, the AlGaN layer 171 is used as the first layer on the back surface 10b side of the processed wafer 10. The GaN layer 172 is used as the second layer on the front surface 10a side of the processed wafer 10. As another example, the GaN layer 172 may be used as the first layer and the AlGaN layer 171 may be used as the second layer. As further another example, an InGaN layer may be used as one of the first layer and the second layer, and a GaN layer may be used as the other of the first layer and the second layer. As yet another example, an InGaN layer may be used as one of the first layer and the second layer, and an AlGaN layer may be used as the other of the first layer and the second layer. Moreover, each of the first layer and the second layer may be composed of another layer as long as it enables a GaN single crystal to be epitaxially grown thereon.

Third Embodiment

Figure 12:
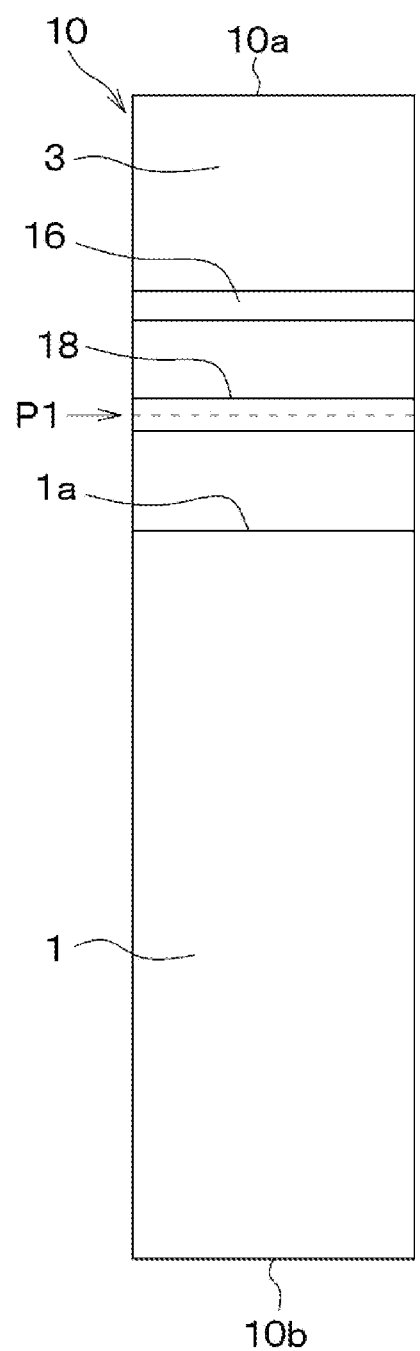
FIG. 12 is a cross-sectional view of a processed wafer after an epitaxial process in a manufacturing method for a semiconductor device according to a third embodiment.

In a third embodiment, as shown in FIG. 12, an absorption layer 18 is formed in addition to the forming of the reflective layer 16 inside the epitaxial layer 3 in the epitaxial process of the first embodiment. The absorption layer 18 is formed at a position of the epitaxial layer 3 of the processed wafer 10 including the planned formation position P1 where the modified layer 15 is to be formed.

Figure 13:
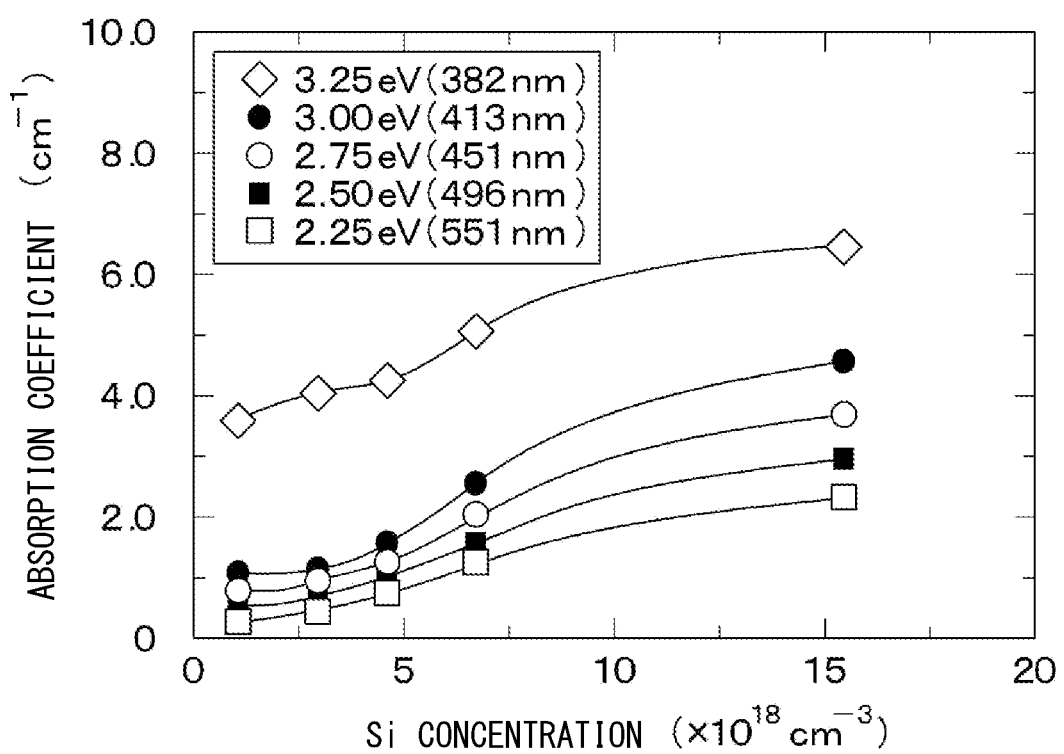
FIG. 13 is a diagram showing the relationship between an Si concentration and an absorption coefficient.

The absorption layer 18 absorbs the laser beam La emitted in the laser slicing process. The absorption layer 18 is composed of a GaN single crystal containing a conductive type impurity of p-type or n-type, and the concentration of the conductive type impurity of the absorption layer 18 is higher than a remaining part of the epitaxial layer 3 of the processed wafer 10 other than the absorption layer 18. Thus, the absorption layer 18 is a layer having a high light absorption coefficient. For example, in a case where Si is used as the conductive type impurity, as shown in FIG. 13, when the Si concentration is increased from $1 \times 10^{18}$ cm$^{-3}$ to $1 \times 10^{19}$ cm$^{-3}$, the absorption coefficient relative to the light in the wavelength band from about 380 nm to about 550 nm increases approximately three to four times.

The thickness of the absorption layer 18 is, for example, 1 μm or more and 5 μm or less. Other configurations of the manufacturing method for the semiconductor device of the third embodiment are similar to those of the first embodiment.

According to the present embodiment, the absorption coefficient is high at the planned formation position P1 of the modified layer 15 in the epitaxial layer 3, that is, at the focal point of the laser beam La. Therefore, the modified layer 15 can be efficiently formed inside the processed wafer 10 by being irradiated with the laser beam La in the laser slicing process. In other words, the modified layer 15 can be formed even by using a laser beam with a relatively low power density. Further, the reflective layer 16 can reflect the light with the relatively small power density leaked from the modified layer 15. Therefore, as compared with the first embodiment, it is possible to further suppress the arrival of leaked light to the front surface-side device-constituent part 11.

Similar to the first embodiment, when the portion of the device constituent wafer 30 on the back surface 30b side is removed in the flattening process, the absorption layer 18 is removed together with the reflective layer 16. Therefore, the absorption layer 18 does not remain in the device after manufactured.

In the present embodiment, the absorption layer 18 is formed in the epitaxial layer 3 of the processed wafer 10 at a position including the planned formation position P1 of the modified layer 15. However, the absorption layer 18 may be formed in the epitaxial layer 3 of the processed wafer 10 at a position between the planned formation position P1 of the modified layer 15 and the reflective layer 16. In this case, the leaked light is absorbed by the absorption layer 18 and the leaked light passing through the absorption layer 18 is reflected by the reflective layer 16. As a result, it is possible to further suppress the leakage light from reaching the front surface-side device-constituent part 11 as compared with the case where only the reflective layer 16 is formed.

Instead of the reflective layer 16, the reflective layer 17 of the second embodiment may be formed.

Other Embodiments (1) In each of the embodiments described above, the reflective layers 16 and 17 are removed in the flattening process. However, the reflective layers 16 and 17 may not be removed.

(2) In each of the embodiments described above, the planned formation position P1 of the modified layer 15 in the laser slicing process is inside the epitaxial layer 3. However, the planned formation position P1 is not limited to the indicated position. The planned formation position P1 of the modified layer 15 may be at the interface between the base material substrate 1 and the epitaxial layer 3. Further, the planned formation position P1 of the modified layer 15 may be inside the base material substrate 1. Note that, in both cases, the reflective layers 16 and 17 are formed inside the epitaxial layer 3.

(3) The present disclosure is not limited to the foregoing description of the embodiments and can be modified within the scope of the present disclosure. The present disclosure may also be varied in various other ways. Such variations are not to be regarded as departure from the disclosure, and all such modifications are intended to be included within the scope of the disclosure. The embodiments described above are not independent of each other, and can be appropriately combined except when the combination is obviously impossible. In each of the embodiments described above, individual elements or features of a particular embodiment are not necessarily essential unless it is specifically stated that the elements or the features are essential, or unless the elements or the features are obviously essential in principle.

What is claimed is:

1. A method for manufacturing a semiconductor device, the method comprising:
   preparing a processed wafer that includes a gallium nitride wafer containing a single crystal of gallium nitride and an epitaxial layer that contains a single crystal of gallium nitride and layered on the gallium nitride wafer, the processed wafer having a front surface adjacent to the epitaxial layer and a back surface adjacent to the gallium nitride wafer;
   forming a front surface-side device-constituent part constituting a part of a device in a portion of the processed wafer adjacent to the front surface;
   forming a modified layer extending in a direction along the front surface in an inside of the processed wafer by applying a laser beam on a side of the back surface of the processed wafer so as to irradiate the inside of the processed wafer with the laser beam; and
   dividing the processed wafer at the modified layer into a device constituent wafer including the front surface and a back surface-side wafer including the back surface, wherein
   in the preparing of the processed wafer, the processed wafer prepared includes a reflective layer for reflecting the laser beam in the epitaxial layer and at a position separated from a planned formation position, where the modified layer is to be formed, toward the front surface of the processed wafer by a predetermined distance, and
   the reflective layer includes a layer having a refractive index different from a refractive index of the single crystal of the gallium nitride of the epitaxial layer.

2. The method according to claim 1, wherein
   the device constituent wafer has a front surface adjacent to the front surface-side device constituent part and a back surface opposite to the front surface of the device constituent wafer and from which the back surface-side wafer is separated,
   the method further comprising:
   after the dividing of the processed wafer, removing a portion of the back surface of the device constituent wafer, wherein the predetermined distance is equal to or less than a thickness of the portion of the back surface of the device constituent wafer to be removed in the removing.

3. The method according to claim 2, wherein
the predetermined distance is 10 micrometres or more and 30 micrometres or less.

4. The method according to claim 1, wherein
the reflective layer has a single layer structure made of the layer having the refractive index different from that of the single crystal of the gallium nitride.

5. The method according to claim 4, wherein
the layer of the single layer structure is composed of either an aluminum gallium nitride layer or an indium gallium nitride layer.

6. The method according to claim 1, wherein
the reflective layer has a multilayer structure including a plurality of pairs of a first layer and a second layer having a refractive index different from a refractive index of the first layer, and
the plurality of pairs of the first layer and the second layer are arranged so that the first layers and the second layers are alternately layered.

7. The method according to claim 6, wherein
the first layer has a thickness $d_1$ represented by an equation 2, and
the second layer has a thickness $d_2$ represented by an equation 3, $$d_1 = \frac{\lambda}{4N_1} \quad \text{[Equation 2]}$$

$$d_2 = \frac{\lambda}{4N_2} \quad \text{[Equation 3]}$$

in which $\lambda$ is a wavelength of the laser beam, $N_1$ is the refractive index of the first layer with respect to the laser beam, and $N_2$ is the refractive index of the second layer with respect to the laser beam.

8. The method according to claim 6, wherein
one of the first layer and the second layer is made of gallium nitride; and
the other of the first layer and the second layer is made of either aluminum gallium nitride or indium gallium nitride.

9. The method according to claim 1, wherein
in the preparing of the processed wafer, the processed wafer prepared includes an absorption layer for absorbing the laser beam at a position including the planned formation position where the modified layer is to be formed, or at a position between the planned formation position and the reflective layer, and
the absorption layer has a higher concentration of a conductive type impurity than that of a remaining region of the processed wafer other than the absorption layer.

10. The method according to claim 9, wherein
the absorption layer has a thickness of 1 micrometres or more and 5 micrometres or less.

11. The method according to claim 1, wherein
in the preparing of the processed wafer, the back surface-side wafer is used as the gallium nitride wafer.

12. A semiconductor wafer, which is before being subjected to a laser slicing process for dividing at a modified layer that is to be formed by irradiation with a laser beam, the semiconductor wafer comprising:
a gallium nitride wafer containing a single crystal of gallium nitride;
an epitaxial layer disposed on the gallium nitride wafer and containing a single crystal of gallium nitride, wherein the gallium nitride and the epitaxial layer provide a layered body, the layered body having a front surface adjacent to the epitaxial layer and a back surface adjacent to the gallium nitride wafer;
a front surface-side device-constituent part disposed in a portion of the layered body adjacent to the front surface, the front surface-side device constituent part constituting a part of a device; and
a reflective layer disposed in an inside of the epitaxial layer to extend in a planar direction along the front surface of the layered body, the reflective layer having a refractive index different from a refractive index of the single crystal of gallium nitride of the epitaxial layer.

* * * * *